(12) United States Patent
Karabatsos (10) Patent No.: US 7,563,649 B1
(45) Date of Patent: Jul. 21, 2009

(54) CHIP PACKAGING WITH METAL FRAME PIN GRID ARRAY

(76) Inventor: Chris Karabatsos, 12 Van Keuren Hwy., Kingston, NY (US) 12401

( * ) Notice: Subject to any disclaimer, the term of this patent is extended or adjusted under 35 U.S.C. 154(b) by 162 days.

(21) Appl. No.: 11/567,154

(22) Filed: Dec. 5, 2006

Related U.S. Application Data (60) Provisional application No. 60/772,841, filed on Feb. 13, 2006, provisional application No. 60/742,265, filed on Dec. 6, 2005.

(51) Int. Cl.
H01L 21/44 (2006.01)
H01L 21/48 (2006.01)
H01L 21/50 (2006.01)
(52) U.S. Cl. .................. 438/124; 438/126; 438/127; 257/E23.015
(58) Field of Classification Search ................. 438/112, 438/123, 124, 126, 127, 637, 638; 257/E21.579, 257/E23.015
See application file for complete search history.

(56) References Cited

U.S. PATENT DOCUMENTS

| | | | | |
|---|---|---|---|---|
| 6,130,116 A * | 10/2000 | Smith et al. | .................. | 438/127 |
| 6,228,686 B1 * | 5/2001 | Smith et al. | .................. | 438/117 |
| 6,458,681 B1 * | 10/2002 | DiStefano et al. | ........... | 438/612 |
| 6,586,955 B2 * | 7/2003 | Fjelstad et al. | ............... | 324/754 |
| 2002/0096787 A1 * | 7/2002 | Fjelstad | ....................... | 257/779 |
| 2003/0060032 A1 * | 3/2003 | Beroz et al. | .................. | 438/584 |
| 2005/0098863 A1 * | 5/2005 | Kim | ........................... | 257/670 |

* cited by examiner

*Primary Examiner*—Michelle Estrada
(74) *Attorney, Agent, or Firm*—Mark P. White (57) ABSTRACT

A packaging technology for silicon chips is similar to ball grid array packaging technology of the prior art without, however, the use of printed board substrate of the prior art Instead pins are used that are part of a planar frame, the pins folded to a position 90 degrees from the plane of the frame, after which the frame is disposed in contact with the chip, pads on the frame and the chip are connected, and then entire assembly is then encapsulated. The edges of the frame are then cut off, leaving the encapsulation to maintain the configuration of the package in place.

14 Claims, 15 Drawing Sheets

FRAME over SILICON

CHIP PACKAGING WITH METAL FRAME PIN GRID ARRAY

PROSECUTION HISTORY

This application claims priority based on Provisional Patent 60/742,265 (Dec. 6, 2005), for a "Chip Packaging With Metal Frame Pin Grid Array" and Provisional Patent 60/772,841 (Feb. 13, 2006), for a "Chip Packaging With Metal Frame Pin Grid Array".

FIELD OF THE INVENTION

This invention relates to the field of electronic packaging, and more specifically to the field of packaging of electronic chips containing microcircuits.

DESCRIPTION RELATIVE TO THE PRIOR ART

Figure 1A:
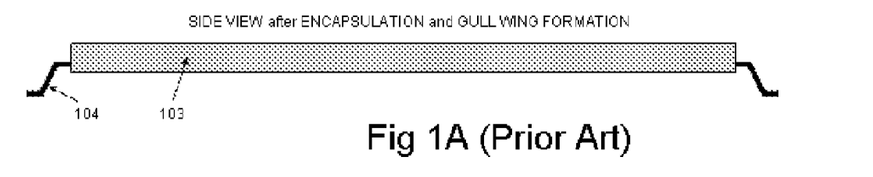
FIG. 1A depicts the gull wing package of the prior art.
Figure 1B:
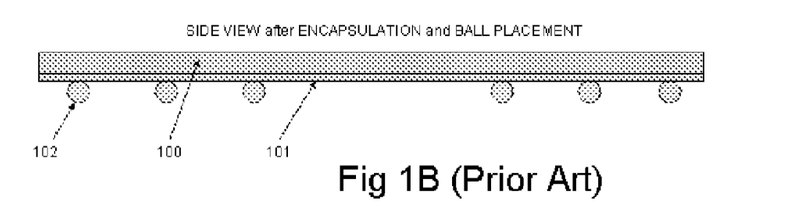
FIG. 1B depicts the, the ball grid array package of the prior art.

The packaging of electronic devices through time has taken different forms and shapes. It is not the purpose of this invention to describe each one. It is rather to the interest of this invention to refer to a couple of them in order to contrast the invention to prior art. In FIG. 1, the two types that have been used extensively in packaging DRAM silicon devices are of interest. Other types of packing techniques, not discussed herein, are also present in the prior art.

One type of prior art packages known as the GULL wing type 104 is constructed with a metallic frame that has the pins formed in the perimeter after encapsulation 103 of the silicon. This type of frame with GULL wing pins served the industry for devices whose operating frequencies were low and the space which the devices occupied on a printed circuit board was not quite at a premium. As the silicon processing geometries shrunk and the requirement for smaller package size and higher operating frequencies increased, the industry adapted a new package known as Ball Grid Array, referred to hereinafter as (BGA). Such a package is shown in FIG. 1 100. The BGA package is constructed in most cases with multi-layered substrate 101 that has pads where the connection is made to pads of the silicon by known means. This connection propagates through substrate wiring to another pad of the substrate in a predefined location of the encapsulated package. At this terminal point a solder ball 102 is attached. The solder ball is the connecting point between a pad on the printed circuit board and a silicon pad. Utilization of space on the face of the package for interconnections instead of the perimeter makes the package smaller and allows for higher frequency operation.

The balls of a BGA package when are soldered on the circuit boards collapse to a solder mass. The solder mass sometimes creates a crack and the connection is compromised. This, eventually, will cause the device to fail. Another problem is when a BGA device is unsoldered from the circuit board no longer maintains the shape of the original balls. It cannot be re-soldered in that form. New balls would have to be attached. This process becomes expensive and as such is undesirable. Not a single unique package can satisfy all needs of the industry.

The method described herein is more applicable to devices of high volume such as memory devices of all kinds and other devices whose number of I/O pins do not present complexity of interconnections.

Figure 9:
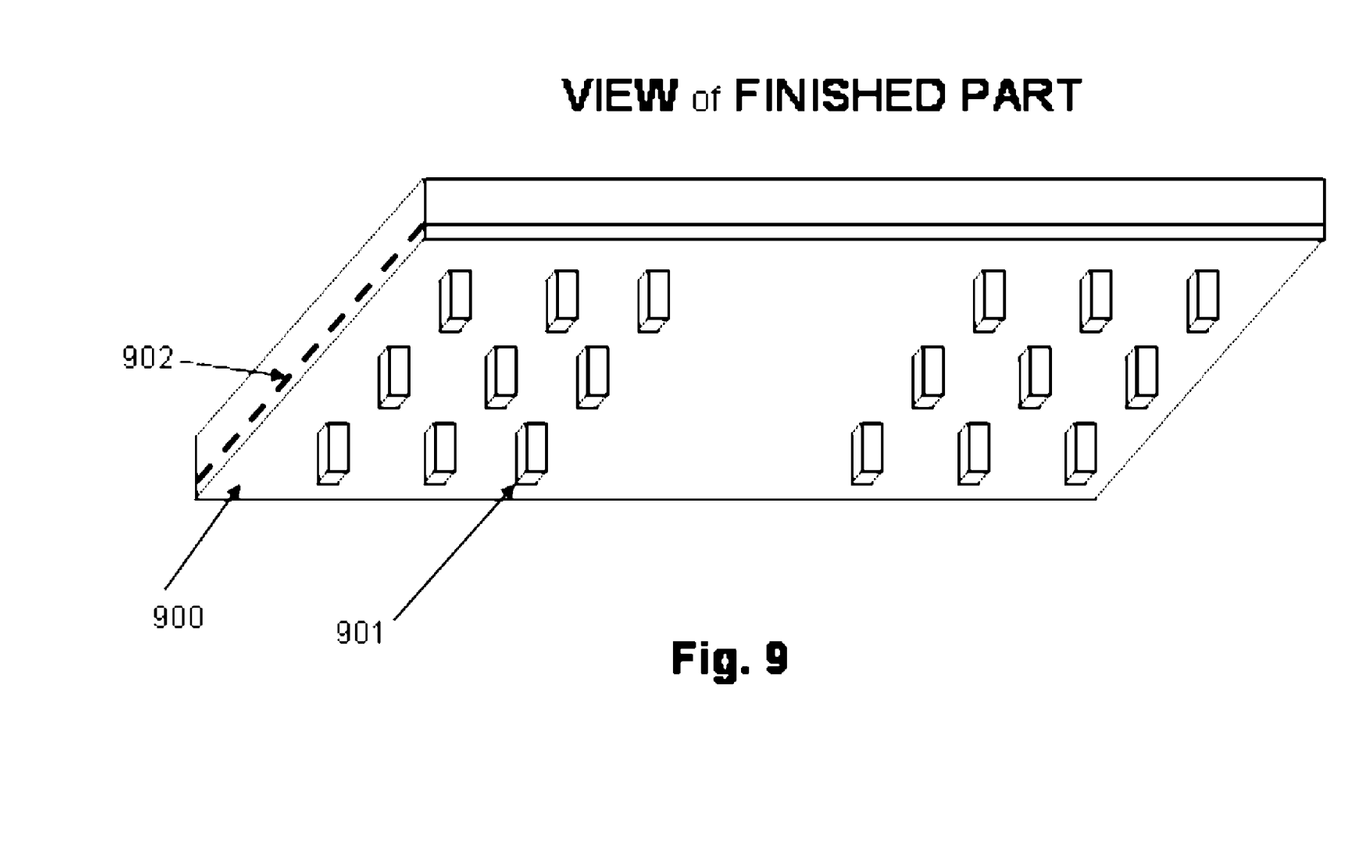
FIG. 9 depicts a view of the final package containing the silicon device and the frame with the pins of the frame protruding from the encapsulation material and in a grid arrangement under the encapsulated body.

The package constructed with this invention would have metallic pins or solder balls for interconnection of the silicon I/O pads to the circuit board pads by use of metallic frame connecting paths. A metallic frame instead of a printed circuit board frame is used. Such a package is shown in FIG. 9. At re-flow time, the solder on the circuit board pads will engulf pin 901 to make the connection. When such device 900 is removed, it can be re-used on the same or other circuit boards. The process of construction of package 900 is less expensive than the present BGA process.

SUMMARY OF THE INVENTION

The present invention comprises an improved packaging system. This packaging system comprises a metallic frame, a silicon chip and the encapsulation of both. The metallic frame is constructed from a thin flat sheet of metal capable of allowing solder to adhere to it. On the face of the metal plate a pattern is exposed by known means and chemicals. The material under the pattern is protected from etching chemicals. The rest of the non-protected metal is allowed to be etched away or removed by known means. After the etching process, the metal of the intended patterns remains held together by the perimeter of un-etched metal material. This perimeter holds the patterned sections in their specified positions. Said etched patterns are formed to accommodate end pads, etched and or formed pins and connecting metal between said pins and respective pads and perimeter. Each etched pattern has an ending pad and a metallic path that connects it to the metal of the perimeter.

In accordance with one aspect of the invention, a method for manufacturing a pin grid array for electronic chip packaging includes the step of creating a frame comprising a multiplicity of printed wires and a multiplicity of corresponding pads, each wire connecting to a corresponding flattened pin and corresponding pad, all within the same plane.

In accordance with a second aspect of the invention, the method includes the further step of bending all of the flattened pins to an angle approximately 90 degrees relative to the plane.

In accordance with a third aspect of the invention the method includes the further step of disposing the frame above a chip comprising pads, aligning the pads of the chip with the corresponding pads of the frame.

In accordance with a fourth aspect of the invention the method includes the further step of electrically connecting each pad of the chip to the corresponding pad of the frame.

In accordance with a fifth aspect of the invention the method includes the further step of encapsulating the frame and chip with the pins extending through the encapsulation.

In accordance with a fifth aspect of the invention the frame further comprises a periphery having sides and ends, wherein each printed wire is attached to one of the ends.

In accordance with a sixth aspect of the invention the method further comprises the step of removing the frame ends where they attach to the flattened wires after encapsulation.

In accordance with a seventh aspect of the invention the connecting of each pad of the chip to the corresponding pad of the frame is done by wire bonding.

In accordance with an eighth aspect of the invention the connecting of each pad of the chip to the corresponding pad of the frame is done by direct connection.

In accordance with a ninth aspect of the invention the flattened pins are stamped, thereby creating a bulge in each pin extending at an angle of 90 degrees relative to the plane.

In another aspect of the invention, in the path and at a predetermined location, a rectangular extension of metal is formed in the form of a rectangular pin of certain length. The collection of the end pads of the pattern become the connecting points to pads of a silicon device.

In one method, the connections can be performed by bonding wires from a formed frame pad to the silicon pad. In another method, the connection can be made directly from pad to pad by solder re-flow means or with heat applied to pre-treated pads. The rectangular formed pins of the patterns are bent 90 degrees with the end of said pins in the perpendicular direction when the entire frame is in a horizontal position. The bending of all pins is accomplished with one operation by special apparatus or tool. This process is fast and accurate. After the pins are bent in a 90 degree position, the entire frame is placed on top of the silicon device in correct alignment of the silicon pads to the pads of the frame.

Then the connection is performed between respective pads by means mentioned above. The arrangement of the silicon and the frame is placed in an apparatus where the encapsulation is performed. The encapsulation apparatus could be the same one used for pin forming. Once the pins are rotated 90 degrees, the open areas of the slots used for the rotation would be plugged to prevent any encapsulation material from escaping.

Another approach would be to have the apparatus restrain the pins in position and separate the frame before encapsulation. In another approach and after the encapsulation, the exposed pins are sheared to the right length and the metal of the perimeter is removed with appropriate means.

The resulting package has the silicon chip and the patterns of the frame inside the encapsulating material. On one face of this package, the pins extend away from the package. On the sides of the package, the metal sections that held the patterns to the perimeter are exposed after the removal of the perimeter. Said exposed metals can serve as testing points for each pin connection to the silicon pad and to the circuit board wiring. Connection of the exposed pins to the circuit board pads is made by known solder re-flow process.

In another aspect of the invention, the pins of the frame described above are formed by methods of metal stretching. A flat section of each connecting metal strap of the patterned frame and at a strategic predefined location a pin protrusion is formed by stretching the metal into a forming cavity of the metal stretching apparatus. Said pin protrusions extend away from the encapsulating material after encapsulation.

In yet another aspect of the invention, the patterned sections of the frame do not have pins formed by any method. Instead, at encapsulation time, the encapsulating material is inhibited from touching the metal at the point where a pin or solder ball is required. After encapsulation, the exposed metal is used to either attach a solder ball or a metallic ball or pin so that the package has connection means to the pads of a printed circuit board at assembly time.

BRIEF DESCRIPTION OF THE DRAWINGS

These, and further features of the invention, may be better understood with reference to the accompanying specification and drawings depicting the preferred embodiments, in which.

DESCRIPTION OF THE PREFERRED EMBODIMENTS

The present invention comprises a system and a method of packaging silicon devices, with pins arranged in a grid formation, without the use of the customary balls of Ball Grid Array.

The final package produced by this invention includes a silicon device, such as a computer chip, contained within an encapsulation of non-conductive material, with an array of conducting contacts designed to mate with the contacts on a motherboard, so that electrical signals may be transmitted and received from the motherboard to the silicon device. The final package, as described above, will be referred to hereinafter as the "package"

The package described in the present invention preferably incorporates the use of a metal frame, and a plurality of metal pins formed as an integral part of the frame.

The preferred method incorporates the holding of the pins in a predetermined location, the forming of said pins by bending or by metal stretching, the exposing of the extended portions of the pins during encapsulation, a connecting of the pads of the frame to the silicon pads, and the encapsulation of the frame and silicon.

Figures 2A, 2B:
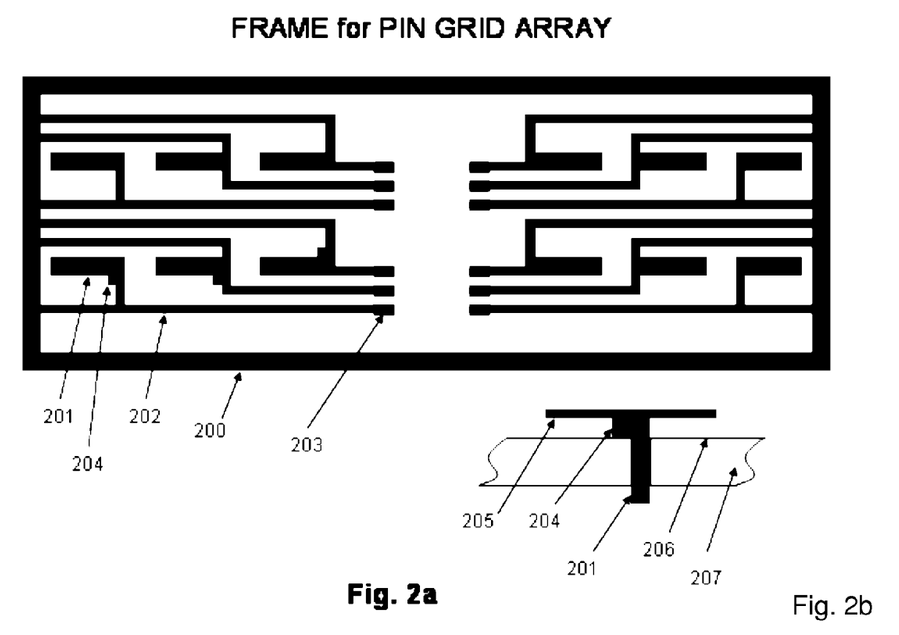
FIG. 2a depicts a metal frame of the Frame Pin Grid Array showing pads, pins, connecting metal and perimeter of the first embodiment of the present invention.
FIG. 2b depicts a cross-section of the assembly, showing pin, after having been bent by 90 degrees, and extending through the encapsulation, in accordance with the first embodiment of the present invention.

FIG. 2 illustrates a frame 200 with printed wires 202 with pads 203 and pins 201 created from a sheet of metal by well-known means in the prior art. Said printed wires 202 have one end connecting to the perimeter of the metal frame 200, and the other end forming pads 203, include integrally-formed rectangular pins 201.

The shape of the printed frame wires could be adjusted to accommodate for thermal expansion and location of the end pads. One such alternative shape could include zigzag or letter "U" formations of the wires at strategic points to allow for thermal expansion and to prevent damage to pad connections. Another advantage of such alternative configurations is to adjust for overall line lengths as a function of temperature.

When manufactured, the frame starts as a flat sheet of metal of a certain rectangular dimension and thickness. The metal composition has properties that allow solder to adhere to metal pins in a solder re-flow process. There are several methods of creating such frame.

In one preferred embodiment and on one face of the metal plate, a pattern of the image of the frame is formed on the face of the metal and the metal is etched, so that the image remains intact, and the rest of the metal plate is removed, by photochemical means well-known in the prior art.

In a second preferred embodiment the image is formed by laser cutting means that eliminates the unwanted metal portion of the plate.

In a third preferred embodiment the patterns on the plate are formed by stamping out the unwanted portions of the metal with a tool and die apparatus.

In a fourth preferred embodiment the patterns on the plate are formed by conductive ink deposition on an insulating material. Solid pins may be formed or attached in predefined locations by mechanical means. Conductive paths may be formed by either ink deposition, or by deposition of conductive epoxy adhesive.

This image of the frame is designed to have pads 203 and pins 201 in pre-determined locations designed to match the approximate location of pads of the silicon chip with which the frame is to be connected. The frame pins, after bending or stretching into a final position, form the grid array of conducting contacts in the final package. A frame of this type, in accordance with the preferred embodiment, is shown in FIG. 2.

After fabrication, the entire frame may be treated with coatings such as melted solder, or may be plated with other metals such as silver, gold, nickel or tin, to improve conduction and to reduce the overall metal inductance and resistance.

The use of such a frame in the manufacturing of electronic devices is not limited to small chips, but is also practical in a variety of many different silicon devices various sizes and shapes.

FIG. 2b depicts a cross section of a small portion of the final package which includes the frame of FIG. 2a. In FIG. 2b the pin 201 has been bent at an angel of 90 degrees relative to the plane of the frame, and extends through the encapsulation 207. A protrusion 204 formed as part of pin 201 allows the pin to extend slightly above the layer of the encapsulation 206. It can be seen from this figure that a small portion of the pin 201 extends below the layer of encapsulation, and it is the array of these protruding portions of the pins that forms the array of pins which mate with the mother board to which the package is to be connected. Not shown in FIG. 2b is the silicon device, which is electrically connected to pad 205 of this figure, after which the silicon device is encapsulated.

Figure 3:
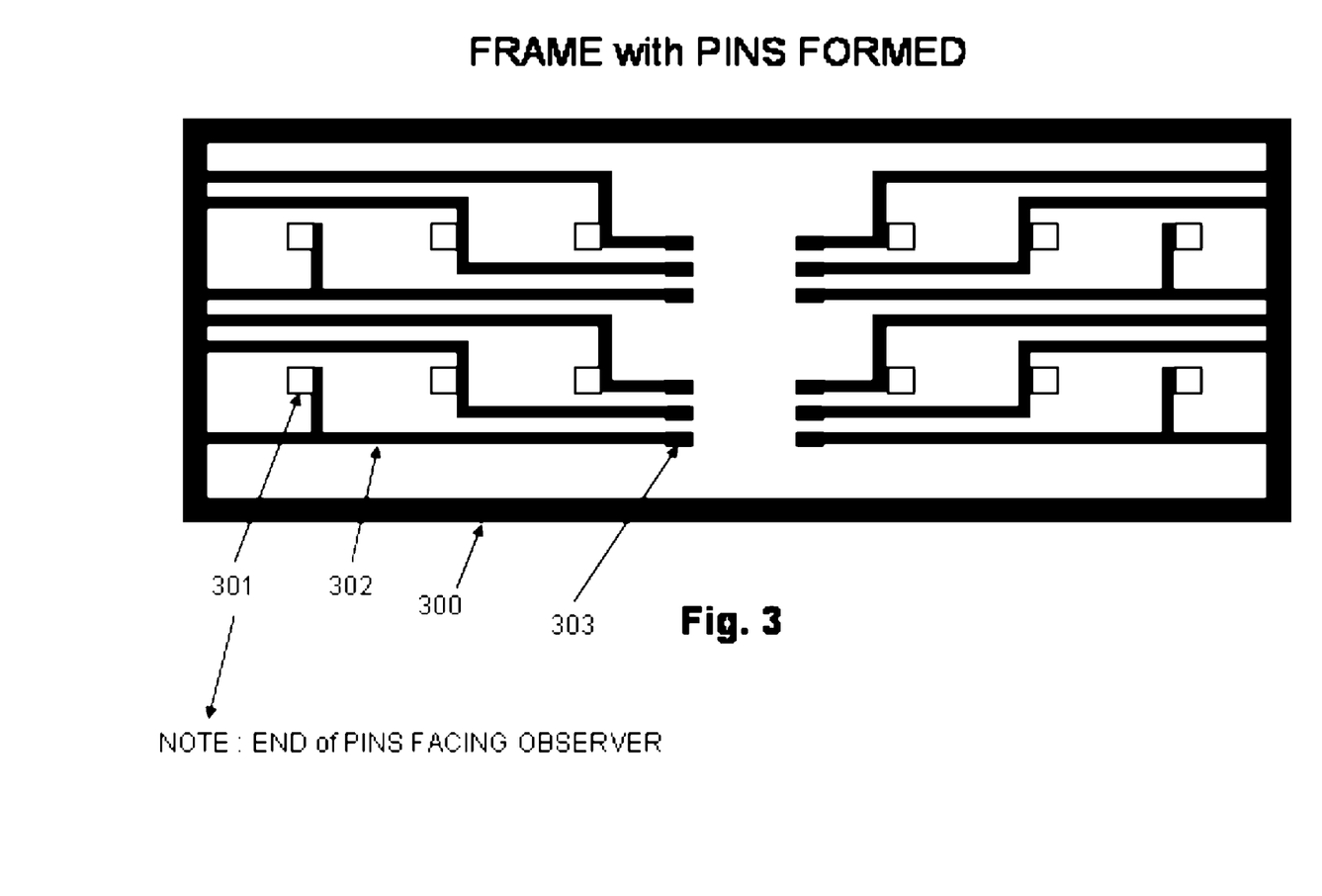
FIG. 3 depicts a metal frame of the Frame Pin Grid Array with pads, connecting metal, perimeter and pins formed in a 90 degree rotation of the second embodiment of the present invention.

FIG. 3 illustrates the frame 200 of FIG. 2 with the rectangular pins 301 rotated by 90 degrees toward the observer, and facing the observer on end.

The method of rotating the pins is generally accomplished by mechanical means, typically by using a die to push all of the pins away from the plane of the frame in a single motion, using an apparatus with plungers in locations that correspond to locations of the frame pins that force the frame pins to rotate within predefined slots of the rigid plate.

Figure 4:
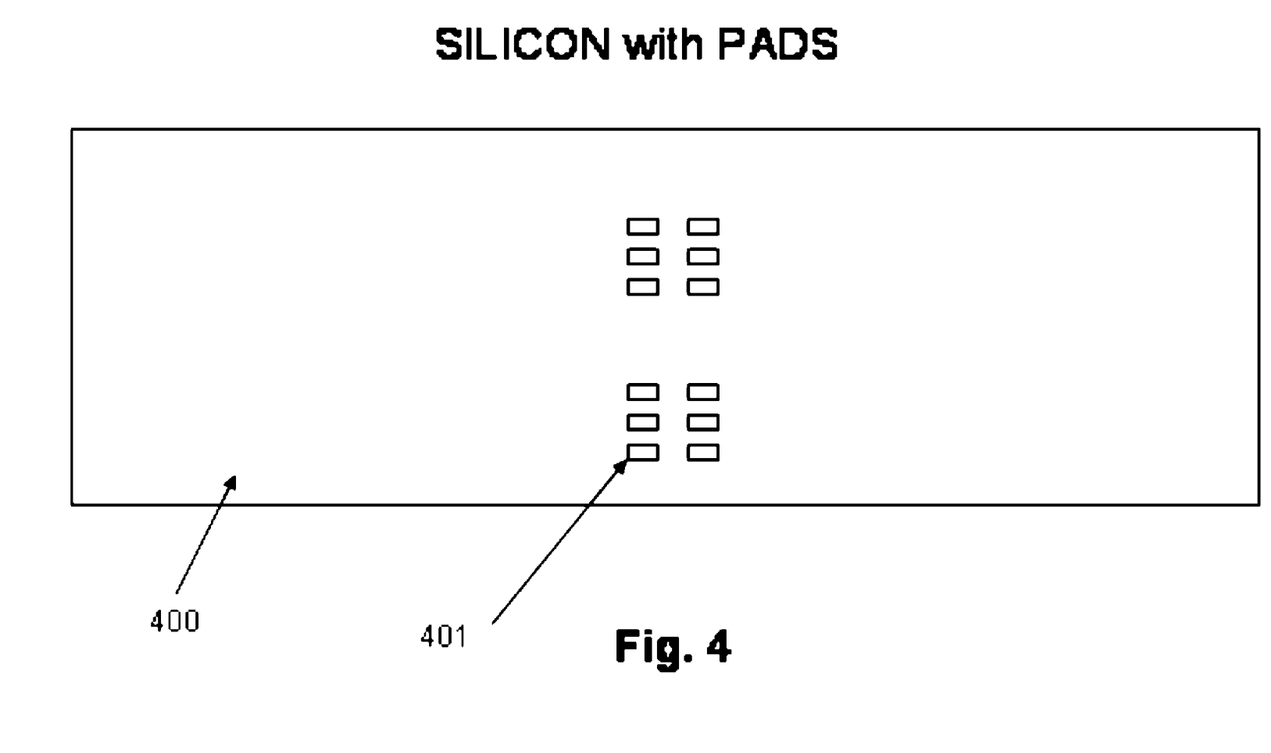
FIG. 4 depicts a face of a silicon device with I/O pads made for bonding wire connection to pads of the frame.

FIG. 4 shows a silicon device with pads formed on the face of the silicon. As shown in this figure, the pads are located in correct alignment with the corresponding pads of the frame. After the frame pins have been rotated by 90 degrees away from the frame, the frame, having the rotated pins directed away from the silicon device, is place on the silicon device, with the pads of the frame and the silicon device aligned. Bonding wires are then connected between each pad of the frame and the corresponding pad of the silicon device, thus making the electrical connections required.

Figure 5:
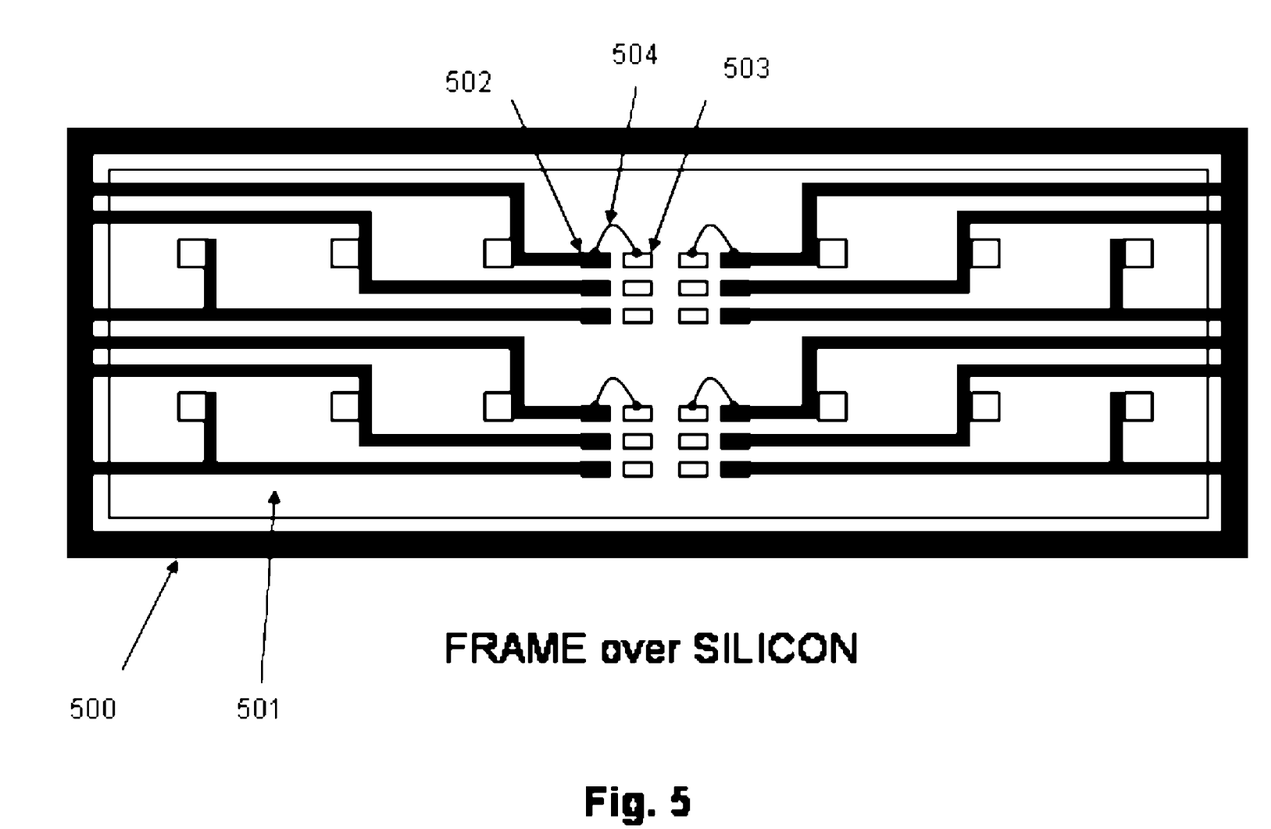
FIG. 5 depicts a frame of FIG. 2 placed on top of silicon of FIG. 4 and bonding wires connecting pads of frame to pads of silicon.

FIG. 5 shows the frame 500 placed and aligned over silicon device 501, with the pads of the frame 502 aligned to silicon device pads 503, and with bonding wires 504 connecting the corresponding pads. It is seen from this figure that the frame 500 is slightly larger than the silicon device, so that the edges of the frame may be removed after encapsulation of the entire package, without cutting into the silicon device. In the preferred embodiment, only the edges of the silicon frame are removed, typically by cutting or stamping. It is clear from this figure that the short ends (the "ends") of the frame must be removed, otherwise all of the pads will be shorted together. The long sides ("sides") of the frame need not be removed, however, and leaving the sides intact within the finished package does not negatively impact the performance of the package in any way.

Figure 6:
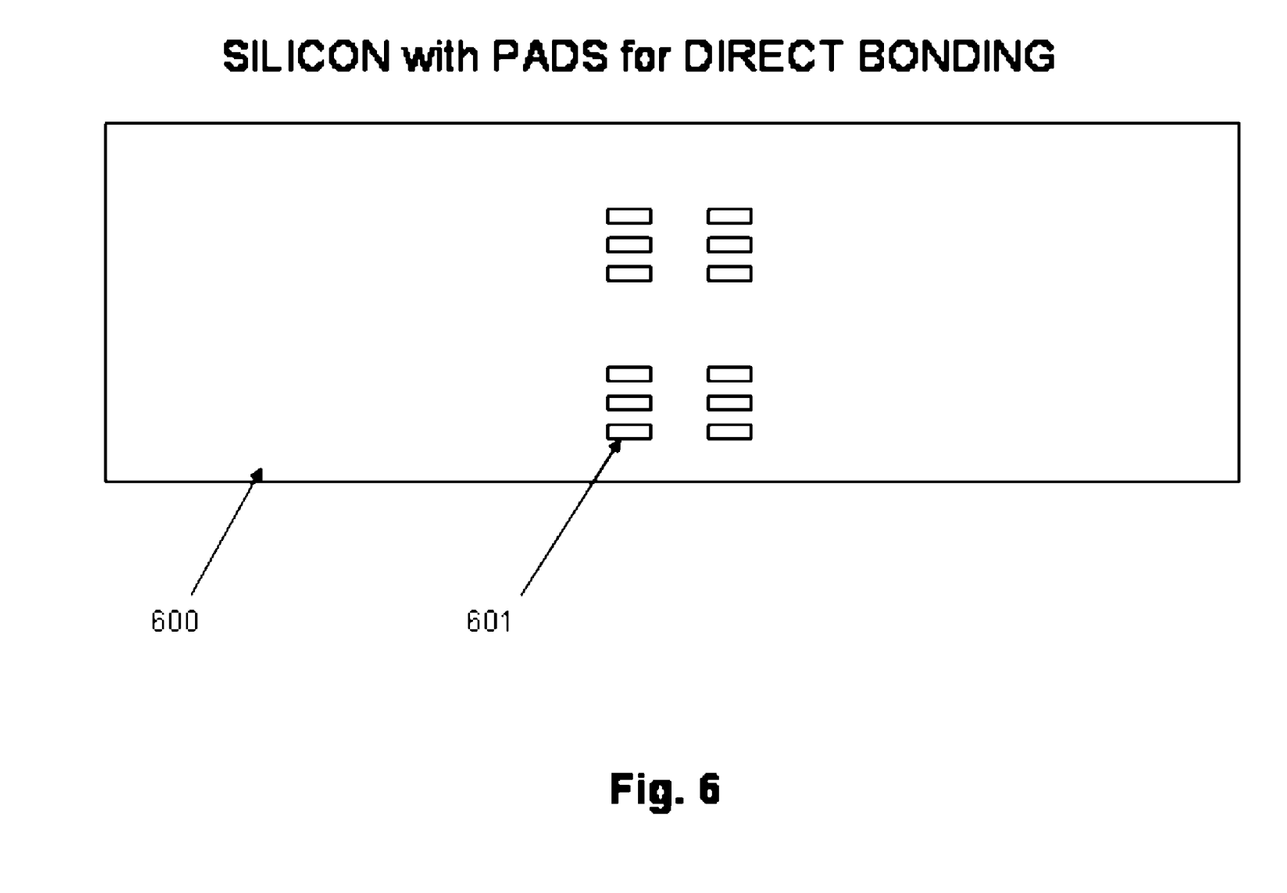
FIG. 6 depicts a face of a silicon device with I/O pads made for direct connection to frame pads.

FIG. 6 illustrates silicon device with pads designed to connect directly to pads of the frame without bonding wires. In this embodiment, which is an alternative to the embodiment of FIG. 5, the electrical connection will be made by simply allowing the pads of the frame to touch the pads of the silicon device. Solder is applied to the pads, and heat used to allow the solder to facilitate electrical conduction. The encapsulation which follows this process provides physical support, so that the pads remain in contact throughout the life of the package.

Figure 7:
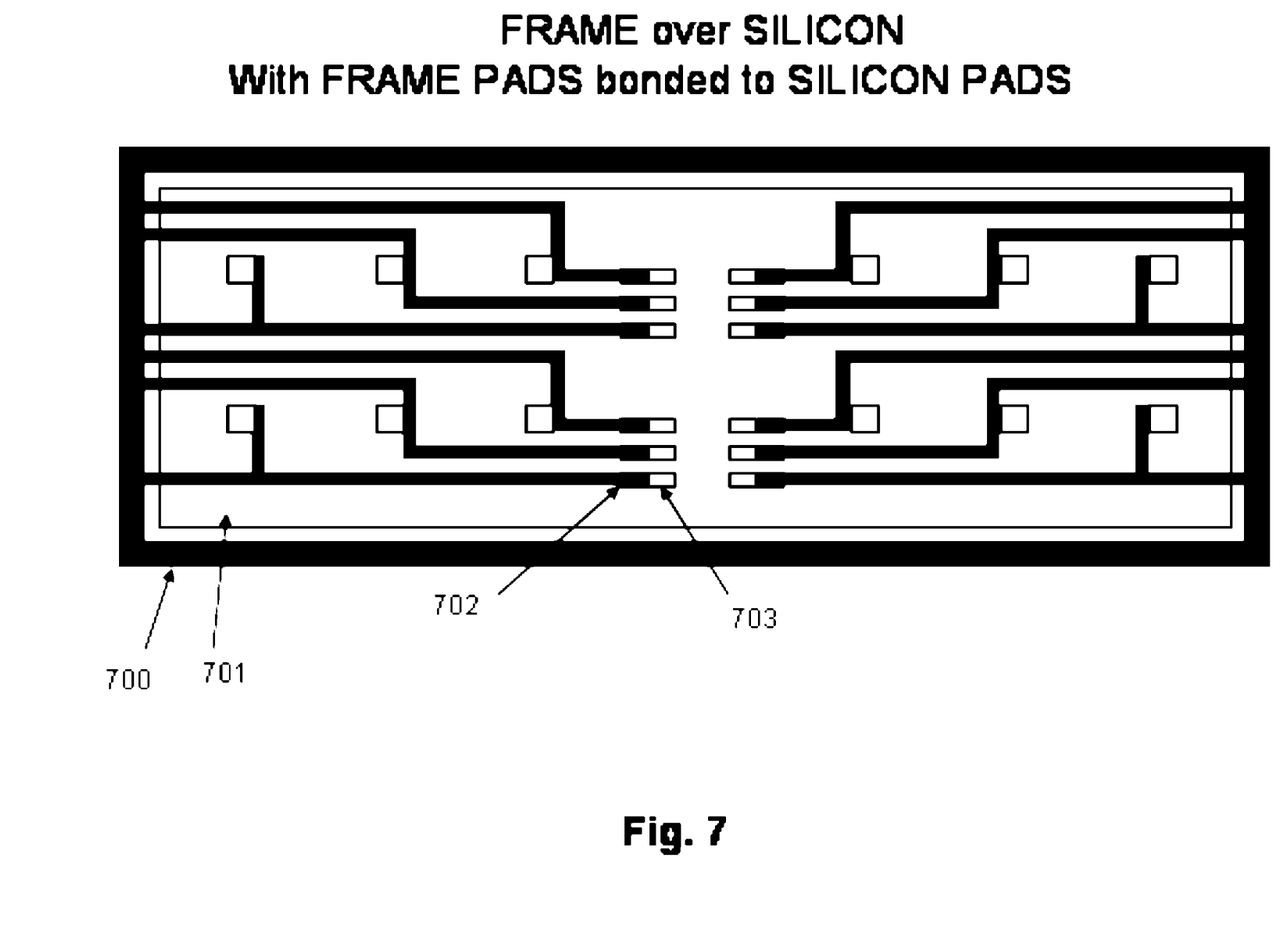
FIG. 7 depicts a metal frame of the Frame Pin Grid Array with pads, connecting metal, perimeter and pins formed in a 90 degree rotation placed on top of the silicon of FIG. 6 with pads of the silicon connected to the pads of the frame by the direct method.

FIG. 7 illustrates silicon device 701 with pads 703 connected directly to pads 702 of frame 700. Connection of pads 702 to 703 is made with re-flow of high temperature solder or with heat applied to two metals to create permanent connection between them.

Figure 8:
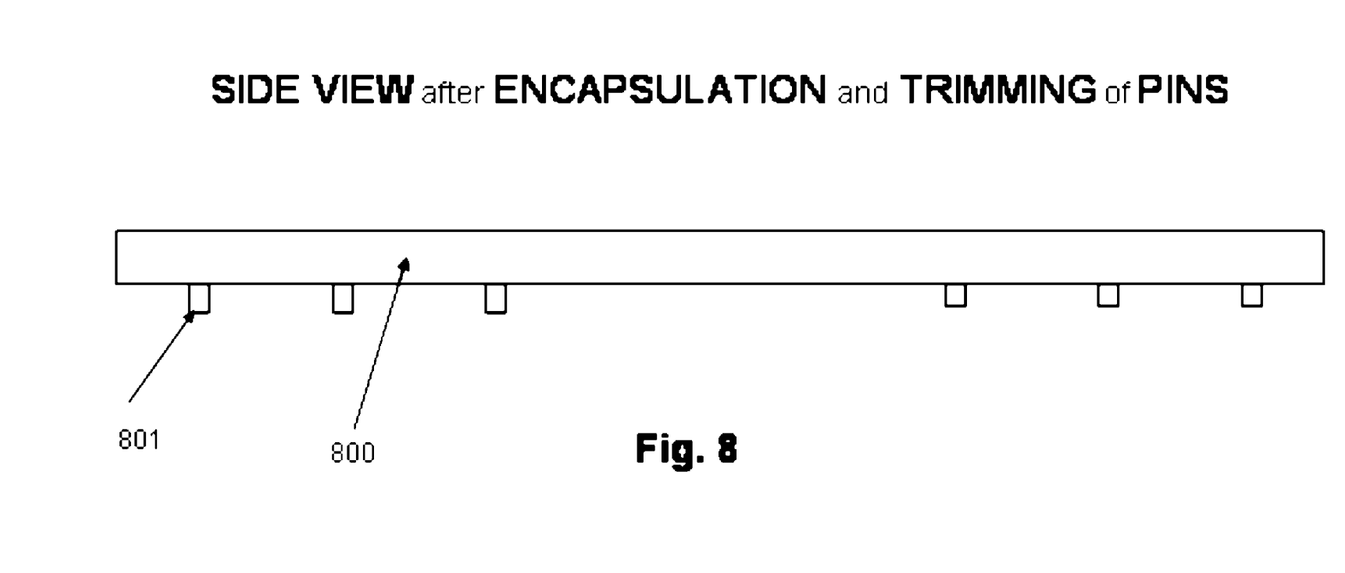
FIG. 8 depicts a side view of the final package containing the silicon device and the frame with the pins of the frame protruding from the encapsulation material.

FIG. 8 illustrates a cross-sectional view of the encapsulated, packaged device 800 with pins 801 protruding perpendicular to the encapsulation. Pins 801 take the place of balls 102 of the prior art, as shown in FIG. 1B.

FIG. 9 depicts a perspective view of the finished package 900 with pins 901 protruding from the bottom of the package. In this view the place 902 where the ends of the frame have been removed after encapsulation is shown at the ends of the package.

Figure 10:
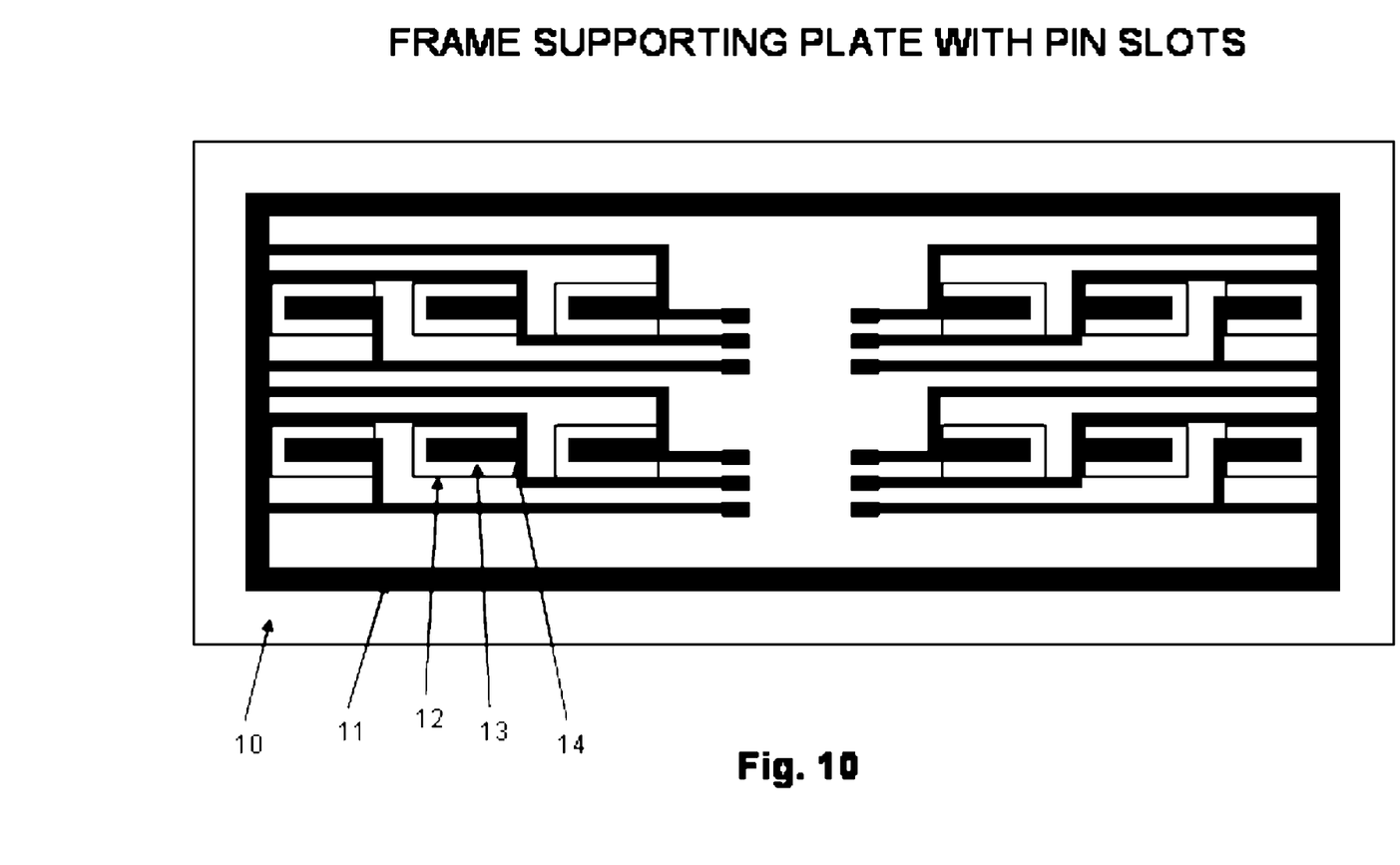
FIG. 10 depicts a forming plate with forming wells and the frame, with pins disposed over the forming plate.

FIG. 10 illustrates the mother board or base plate 10 with multiple wells 12 and the frame 11 and with pins 13 aligned over the wells 12. This figure shows the pins before they have been rotated, and obviously before the frame and silicon device have been connected and encapsulated, and is included herein only to show how the final package will align with the motherboard. The pins will be rotated about pivoting point 14 so that the desirable length of the pins is obtained after pin rotation.

Figure 11:
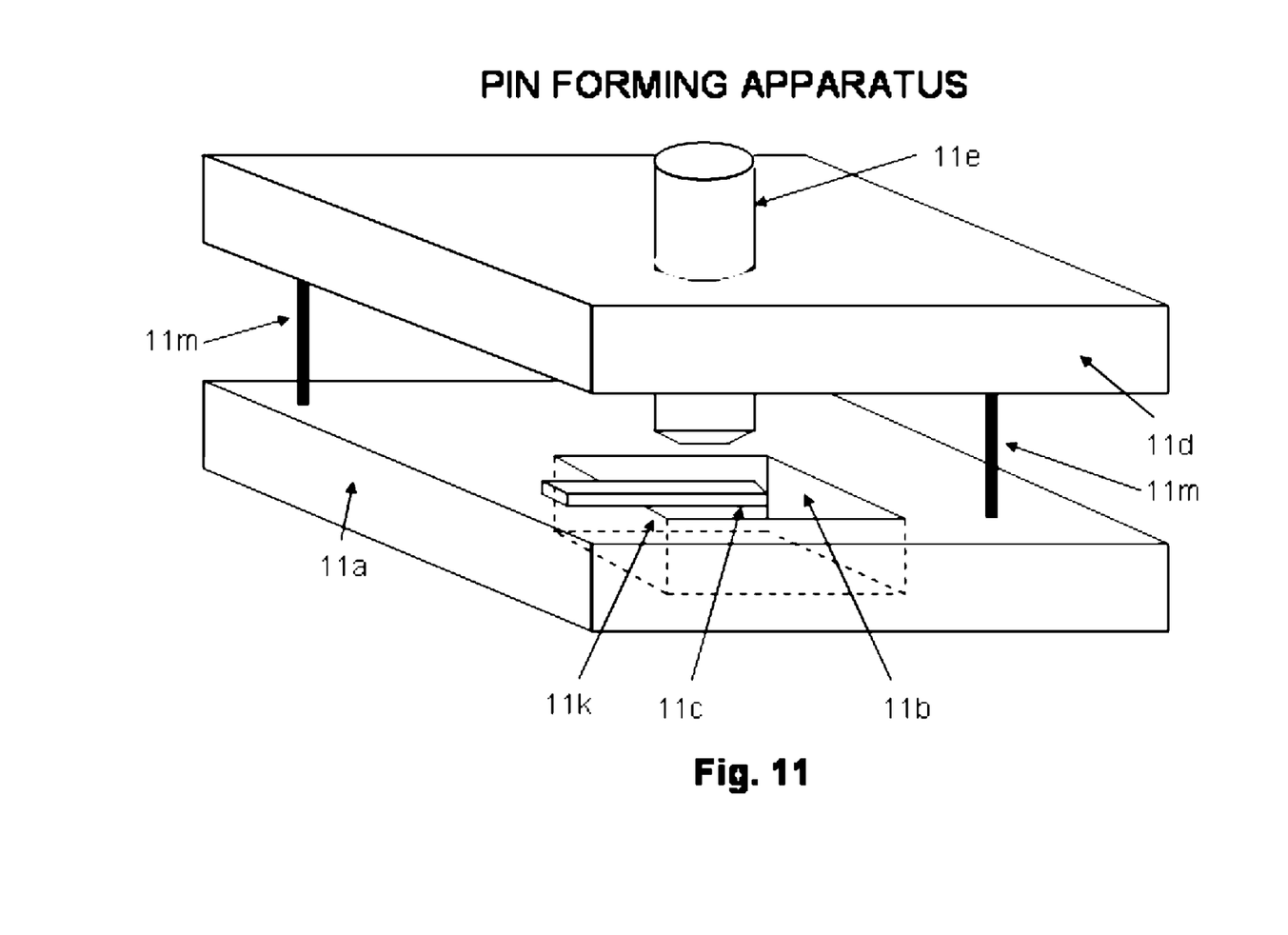
FIG. 11 depicts the pin bending apparatus.

FIG. 11 shows a section of a preferred embodiment of the pin forming apparatus. This embodiment demonstrates how all of the pins could be rotated 90 degrees in a simplified way. Two plates 11a and 1id are aligned with dowel pins 11m. Plate 1id is allowed to slide up and down the dowel pins. Plate 1id accommodates plunger 11e. The plunger is allowed to slide up and down a predetermined distance. Plate 11a accommodates wells 11b. Multiple wells populate the plate in predetermined locations to match the locations of the pins 11c of the frame when said frame pins are aligned to said wells. Pins 11c are aligned so that desirable length of the pin extends into the well. Then plate 1id is lowered and pressed against the frame that is placed between the plates. Finally the plungers are lowered to push pins 11c into the well and in a 90 degree rotation. This apparatus is easily automated for high-volume production.

Figures 12, 12A:
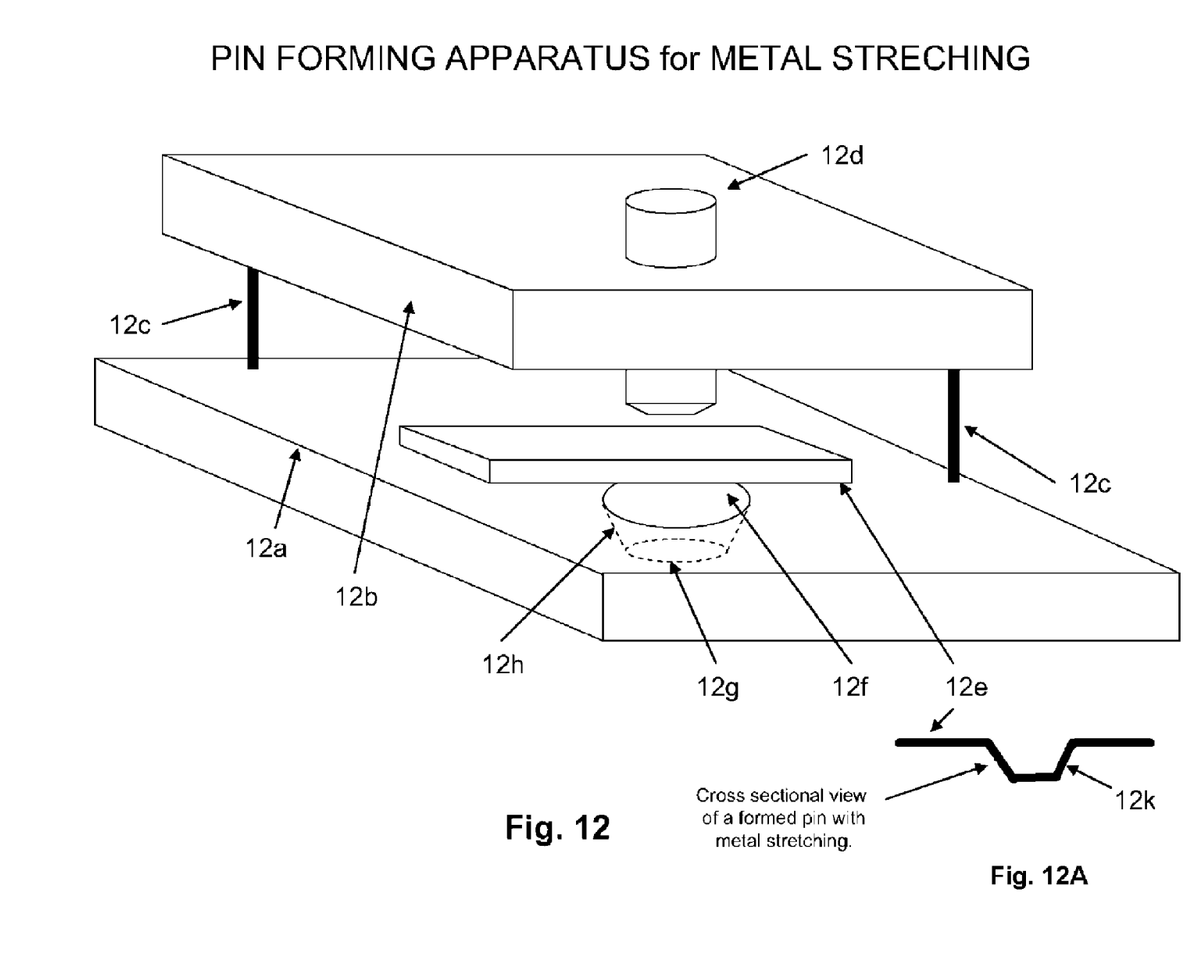
FIG. 12 depicts the metal stretching apparatus.

FIG. 12 illustrates a section of an apparatus which performs contacts by means of metal stretching. This second embodiment demonstrates how a pin can be formed in a simplified way, and creates a contact extending 90 degrees from the plane of the frame without rotating the pins. Two plates 12a and 12b are aligned with dowel pins 12c. Plate 12b is allowed to slide up and down the dowel pins to secure frame 12e between the plates. Plate 12b accommodates plunger 12d. The plunger is allowed to slide up and down a predetermined distance. Plate 12a accommodates wells 12f. Multiple wells populate the plate in predetermined locations. The frame is placed between. plates 12a and 12b in correct alignment. Then plate 12b is pressed against the frame and plate 12a. Then the plungers 12d are pressed to a predetermined extension. The pressure of the plungers forces the metal of the frame to stretch and to extend into the cavity 12f. The well 12f has predetermined depth 12h and bottom diameter 12g.

This resulting metal protrusion will become the point to connect to the pad of the printed circuit board. A cross-sectional view of a protrusion formed by the device of FIG. 12 is shown in FIG. 12A as reference number 12k. Reference number 12e is that portion of the pin parallel to the plane of the frame.

In another aspect of the invention where no pins are formed from the frame with any described method, an apparatus is used to expose the frame metal at strategic locations during the encapsulation of the device and frame.

Figures 13, 13A:
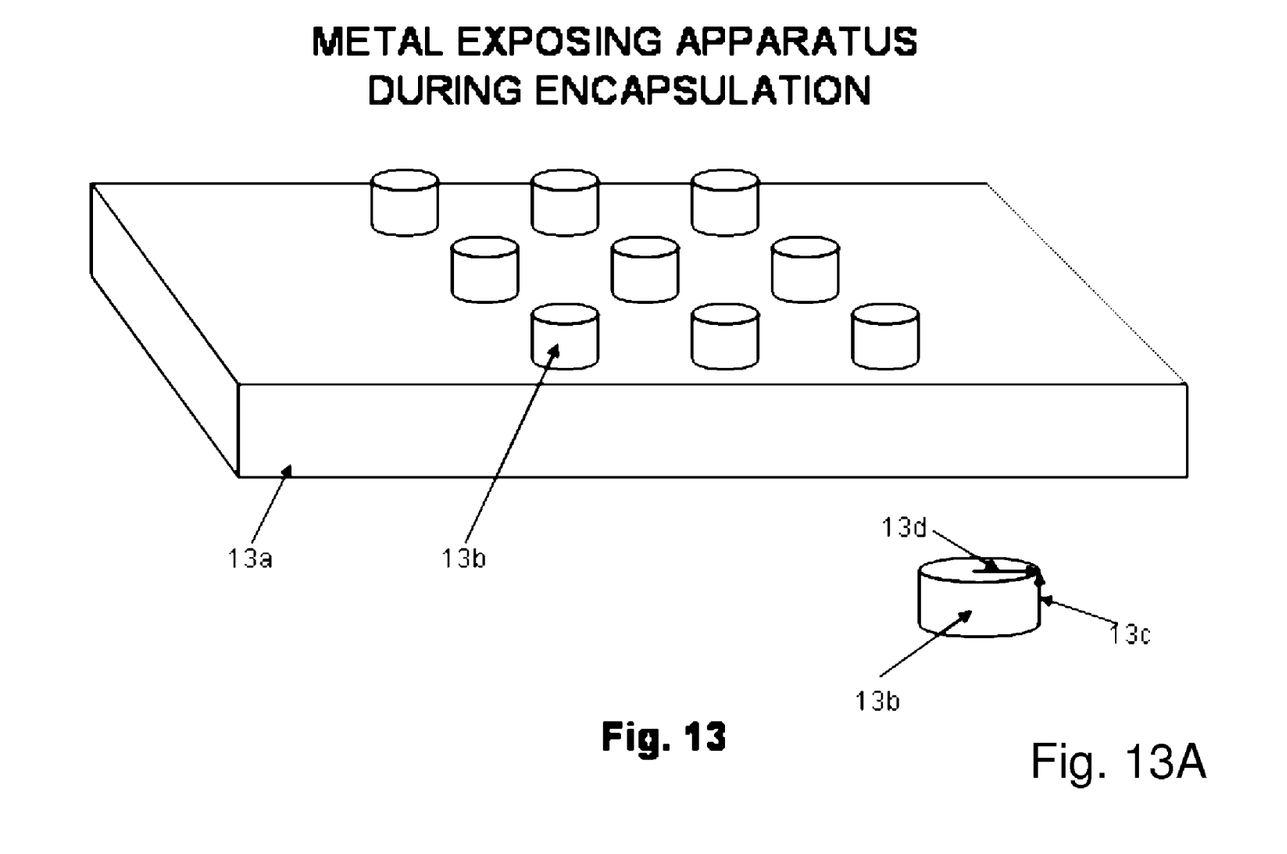
FIG. 13 depicts the metal exposing apparatus.

This may be better understood by referring now to FIG. 13. A plate 13a is constructed so that metal protrusions 13b of certain height 13c and radius 13d are placed in the strategic locations. During encapsulation, the frame with the silicon attached is pressed against the metal protrusions. The encapsulating material is allowed to flow around the protrusions to fill the total cavity that creates the final package. When the package is removed from the encapsulating apparatus, it will contain cavities of the diameter and depth of the apparatus and at the bottom of each cavity the frame metal will be exposed. This exposed metal will be used to be connected to a solder ball or a metallic ball or metallic pin or, simply, to be connected to solder that fills the cavity.

Figure 14:
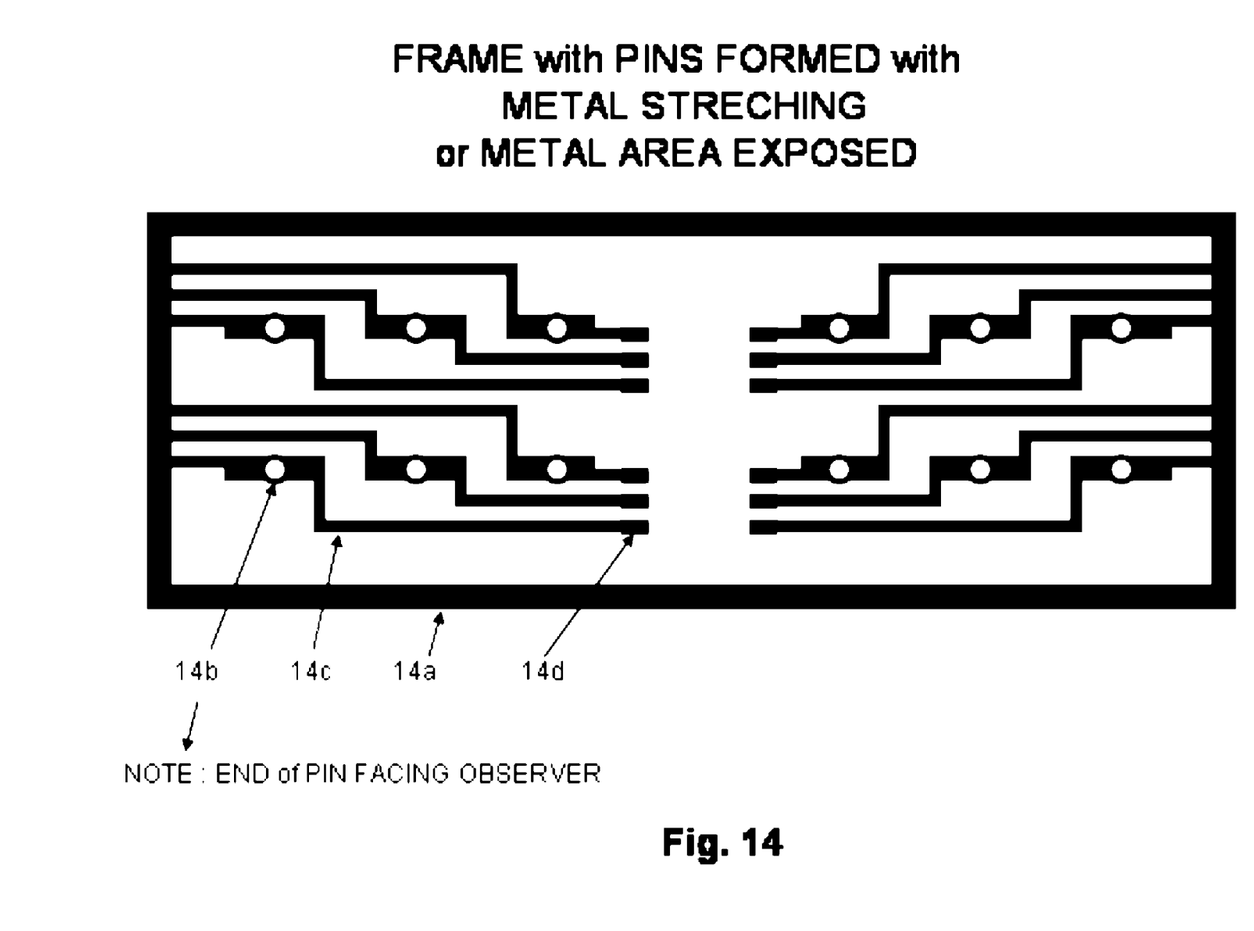
FIG. 14 depicts the metal frame, showing the formed pattern, formed pad, and exposed metal.

Referring next to FIG. 14, the frame 14a, the frame pattern 14c with pad 14d and the protrusion 14b are shown looking perpendicular to the frame after the protrusions are formed. The protrusion locations could be where metal is exposed by the method described in FIG. 13.

Figure 15:
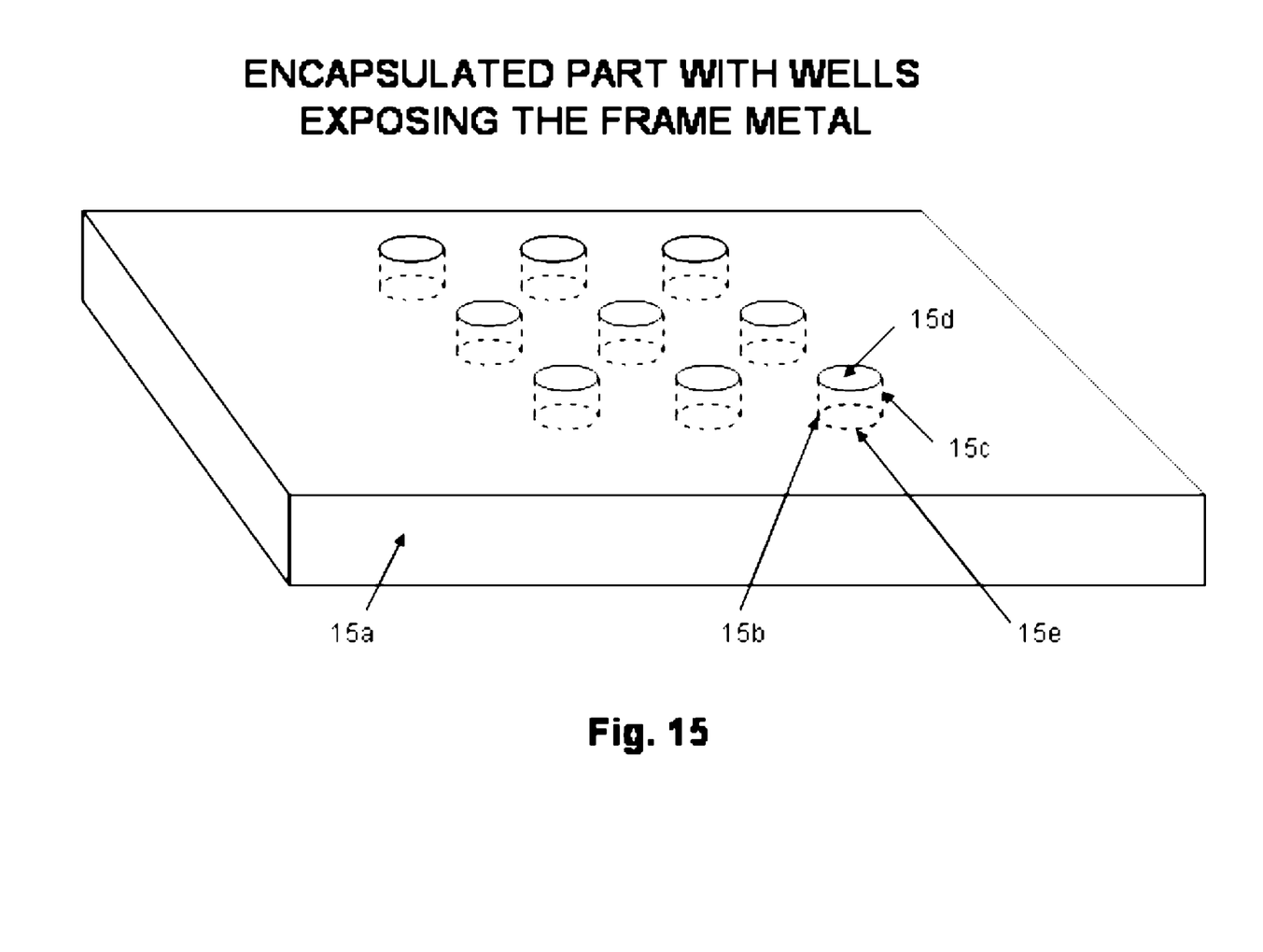
FIG. 15 depicts the encapsulate package showing the wells and the exposed frame.

Next referring to FIG. 15, a finished package is shown with created cavities and exposed metal inside the cavities. The package is not in its final stage since the exposed metal is not yet connected to any solder balls or pins of any kind.

Although it is not shown in any figure, the formation of the silicon pads in an outside perimeter of the silicon and the formation of the frame pads close to the perimeter of the frame to facilitate either wire bonding or direct connection is another method that does not depart from the object of the invention.

It will be apparent that improvements and modifications may be made within the purview of the invention without departing from the scope of the invention defined in the appended claims.

I claim:

1. A method for manufacturing a pin grid array for electronic chip packaging, comprising the steps of:

(a) creating a frame comprising a multiplicity of flattened wires integrally formed therewith, each having a longitudinal axis, and a multiplicity of corresponding electrically conducting frame pads, each flattened wire electrically connecting to a corresponding flattened pin and to a corresponding frame pad, and all disposed within the same plane;
   (b) rotating each of the flattened wire approximately 90 degrees about its longitudinal axis so that it remains substantially within the plane of the frame, so that each pin is disposed at an angle normal to the plane of the frame;
   (c) disposing the frame in proximity to a chip comprising chip pads, aligning the chip pads with the corresponding frame pads;
   (d) electrically connecting each chip pad to the corresponding frame pad; and
   (e) encapsulating the frame and chip with the pins extending through the encapsulation, so that the pins may be electrically connected to another electronic or electrical assembly.

2. The method of claim 1, wherein the frame further comprises a periphery, said periphery comprising sides and ends, wherein each flattened wire is attached to one of the ends, the method further comprising the step of removing the frame ends where they attach to the flattened wires, after encapsulation.

3. The method of claim 2, wherein the electrically connecting each chip pad to the corresponding frame pad further comprises wire bonding.

4. The method of claim 2, wherein the electrically connecting each chip pad to the corresponding frame pad further comprises direct connection.

5. The method of claim 2, wherein the method further comprises forming the frame from a single flat piece of metal by means comprising etching.

6. The method of claim 2, wherein the method further comprises forming the frame from a single flat piece of metal by laser cutting.

7. The method of claim 2, wherein the method further comprises forming the frame from a single flat piece of metal by stamping.

8. The method of claim 3, wherein the method further comprises forming the frame from a single flat piece of metal by means comprising etching.

9. The method of claim 3, wherein the method further comprises forming the frame from a single flat piece of metal by laser cutting.

10. The method of claim 3, wherein the method further comprises forming the frame from a single flat piece of metal by stamping.

11. The method of claim 4, wherein the method further comprises forming the frame from a single flat piece of metal by means comprising etching.

12. The method of claim 4, wherein the method further comprises forming the frame from a single flat piece of metal by laser cutting.

13. The method of claim 4, wherein the method further comprises forming the frame from a single flat piece of metal by stamping.

14. The method of claim 1, further comprising testing the encapsulated frame and chip by means comprising attaching a testing device to the wires exposed after removal of the perimeter of the frame.

* * * * *